United States Patent
Kao et al.

(10) Patent No.: US 8,001,491 B2
(45) Date of Patent: Aug. 16, 2011

(54) ORGANIC THIN FILM TRANSISTOR AND METHOD OF FABRICATING THE SAME

(75) Inventors: Chi-Jen Kao, Taipei (TW); Yu-Rung Peng, Taoyuan County (TW); Tsung-Hua Yang, Kaohsiung (TW); Yi-Kai Wang, Hsinchu (TW); Tarng-Shiang Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 340 days.

(21) Appl. No.: 12/344,255

(22) Filed: Dec. 25, 2008

(65) Prior Publication Data
US 2010/0096620 A1    Apr. 22, 2010

(30) Foreign Application Priority Data
Oct. 20, 2008   (TW) ............................... 97140161 A (51) Int. Cl.
*G06F 17/50* (2006.01)
*H01L 29/08* (2006.01)
*H01L 29/04* (2006.01)
*H01L 21/00* (2006.01)
*H01L 51/40* (2006.01)

(52) U.S. Cl. ............... 716/30; 716/50; 716/51; 716/53; 716/54; 257/40; 257/59; 438/30; 438/99

(58) Field of Classification Search ............ 716/30, 716/50, 51, 53, 54; 257/40, 59; 438/30, 438/99
See application file for complete search history.

(56) References Cited

U.S. PATENT DOCUMENTS

| | | | |
|---|---|---|---|
| 4,623,601 A | 11/1986 | Lewis et al. | |
| 4,781,765 A | 11/1988 | Watanabe et al. | |
| 5,569,332 A | 10/1996 | Glatfelter et al. | |
| 6,500,604 B1 | 12/2002 | Dimitrakopoulos et al. | |
| 6,979,583 B2 * | 12/2005 | Bae et al. | 438/34 |
| 7,132,801 B2 * | 11/2006 | Park et al. | 315/169.3 |
| 7,638,358 B2 * | 12/2009 | Oh et al. | 438/99 |
| 7,727,797 B2 * | 6/2010 | Kim et al. | 438/99 |

(Continued)

FOREIGN PATENT DOCUMENTS
EP    1727206    11/2006
(Continued)

OTHER PUBLICATIONS

Nomoto et al.; "A high-performance short-channel bottom-contact OTFT and its application to AM-TN-LCD"; Publication Year: 2005; Electron Devices, IEEE Transactions on; vol. 52, Issue: 7; pp. 1519-1526.*

*Primary Examiner* — Helen Rossoshek
(74) *Attorney, Agent, or Firm* — Jianq Chyun IP Office (57) ABSTRACT

A method of fabricating an organic thin film transistor is provided. The method includes forming a source, a drain and a gate on a substrate and forming a dielectric layer to isolate the gate from the source and isolate the gate from the drain. An organic active material layer is formed on the substrate to fill a channel region between the source and the drain and cover the source and the drain. A barrier material layer is formed on the organic active material layer. Thereafter, the barrier material layer and the organic active material layer are patterned to form a barrier layer and an organic active layer and expose the source and the drain.

24 Claims, 6 Drawing Sheets

U.S. PATENT DOCUMENTS

| | | | |
|---|---|---|---|
| 2004/0119073 | A1 | 6/2004 | Ardakami et al. |
| 2005/0009231 | A1 | 1/2005 | Karg et al. |
| 2006/0046339 | A1 | 3/2006 | Seo et al. |
| 2006/0216852 | A1 | 9/2006 | Suh et al. |
| 2006/0249732 | A1* | 11/2006 | Shirasaki et al. ............... 257/59 |
| 2006/0286314 | A1 | 12/2006 | Park et al. |
| 2008/0237580 | A1* | 10/2008 | Okuyama et al. ............... 257/40 |
| 2009/0117686 | A1* | 5/2009 | Huang et al. .................... 438/99 |
| 2009/0321727 | A1* | 12/2009 | Yutani et al. .................... 257/40 |
| 2010/0006832 | A1* | 1/2010 | Oh et al. ......................... 257/40 |
| 2010/0078639 | A1* | 4/2010 | Nomoto et al. ................. 257/57 |
| 2010/0090204 | A1* | 4/2010 | Chuman et al. ................. 257/40 |
| 2010/0176381 | A1* | 7/2010 | Yagi et al. ....................... 257/40 |
| 2010/0219402 | A1* | 9/2010 | Katsuhara et al. .............. 257/40 |

FOREIGN PATENT DOCUMENTS

| | | |
|---|---|---|
| GB | 2418065 | 12/2006 |
| KR | 20060102697 | 9/2006 |
| KR | 20060132395 | 12/2006 |
| WO | 2006048833 | 5/2006 |

* cited by examiner

ORGANIC THIN FILM TRANSISTOR AND METHOD OF FABRICATING THE SAME

CROSS-REFERENCE TO RELATED APPLICATION

This application claims the priority benefit of Taiwan application serial no. 97140161, filed on Oct. 20, 2008. The entirety of the above-mentioned patent application is hereby incorporated by reference herein and made a part of this specification.

BACKGROUND OF THE INVENTION

1. Field of the Invention

The present invention relates to a thin film transistor (TFT) and method of fabricating the same, and more particularly, to an organic thin film transistor (OTFT) and method of fabricating the same.

2. Description of Related Art

Along maturation of technology, lighter, thinner, portable and flexible displays such as electronic paper have caught attention of many people, and many large companies have participated in their development OTFTs utilize organic molecular materials to develop TFTs suitable for electronic products. OTFTs have greatest advantages of being able to be fabricated under low temperatures, having simple processes, being able to be made in large areas, low fabricating costs, and being able to maintain transistor element properties even when panels are bent to achieve effects of normal imaging quality. Applications as such may accelerate realization of flexible electronic products such as displays.

SUMMARY OF THE INVENTION

The present invention provides a method of fabricating an OTFT, which comprises forming a source, a drain and a gate on a substrate, and forming a dielectric layer to isolate the gate from the source and the drain. An organic active material layer is formed on the substrate to fill a channel region between the source and the drain and cover the source and the drain. A barrier material layer is formed on the organic active material layer. Thereafter, the barrier material layer and the organic active material layer are patterned to form a barrier layer and an organic active layer; exposing the source and the drain.

The present invention further provides an OTFT, which comprises a gate, a source, a drain, a dielectric layer, an organic active layer and a barrier layer. The gate is disposed on a substrate; the source and the drain are disposed on two sides of the gate. The dielectric layer is disposed on the substrate to isolate the gate from the source and the drain. The organic active layer is disposed on a channel region between the source and the drain, corresponding to the gate. The barrier layer is disposed on the organic active layer.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A method of fabricating an OTFT of the present invention uses photolithographic and etching processes to pattern an organic active material layer. Most or all of the organic active material layer covering a source and a drain is removed, so that an organic active layer only is formed on a channel region between the source and the drain. In the present invention, before performing the photolithographic process to the organic active material layer, a barrier layer is formed on the organic active material layer. Since the organic active material layer avoids being destroyed by a subsequent process of removing a photoresist layer with protection of the barrier layer, the formed OTFT has excellent device characteristics. The following uses a method of fabricating an OTFT of a top gate structure and a method of fabricating an OTFT of a bottom gate structure as examples to illustrate the present invention, but the present invention is not limited to the examples.

FIGS. 1A to 1D are cross-sectional views illustrating a method of fabricating an OTFT of a top gate structure according to an embodiment of the present invention.

Figure 1A:
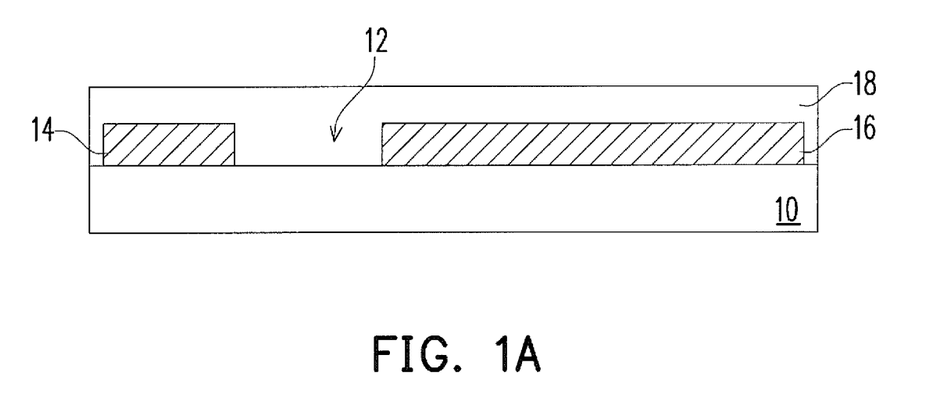
FIGS. 1A to 1D are cross-sectional views illustrating a method of fabricating an OTFT of a top gate structure according to an embodiment of the present invention.

Referring to FIG. 1A, in the method of fabricating the OTFT according to the present embodiment, a source 14 and a drain 16 (or a source 16 and a drain 14) are formed on a substrate. A channel region 12 is formed between the source 14 and the drain 16 (or the source 16 and the drain 14). The substrate 10 may be a rigid substrate or a flexible substrate. A material of the rigid substrate is, for example, glass, quartz or silicon wafer. A material of the flexible substrate is, for example, plastic such as acrylic, metal foil or paper. The source 14 and the drain 16 (or the source 16 and the drain 14) are formed by, for example, forming a conductive material layer and patterning the conductive material layer. A material of the conductive material layer is, for example, a metal such as aluminum, copper, molybdenum, chromium or alloys of above. A method of forming the conductive material layer comprises performing a physical vapor deposition process such as a sputtering process or an evaporation process. According to another embodiment, a method of forming the source 14 and the drain 16 (or the source 16 and the drain 14) may comprise directly forming a patterned conductive layer, for example fabricating with a conductive inkjet printing method or other printing or transfer printing technologies.

Then, an organic active material layer 18 is formed on the substrate 10. A material of the organic active material layer 18 is, for example, an organic material including an N-type or P-type organic small molecule, an organic polymer, or a mixture of an organic small molecule and an organic polymer. A material of the organic small molecule is, for example, pentacene. A material of the organic polymer is, for example, poly-(3-hexylthiophene) (P3HT) or polyacrylic acid (PAA). A method of forming the organic active material layer 18 is a solution process such as a spin coating method, a die coating method and a roll coating method.

Figure 1B:
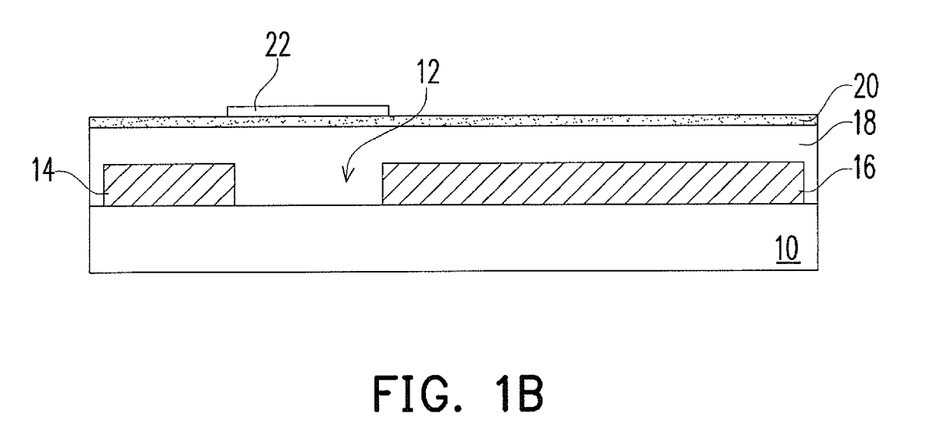

Afterwards, referring to FIG. 1B, a barrier material layer 20 is formed on the organic active material layer 18. A material of the barrier material layer 20 includes a dielectric material. The dielectric material includes poly-4-vinylphenol (PVP), polyvinyl alcohol (PVA) or parylene. The material of the barrier material layer 20 and a material of a dielectric layer 24 (as shown on FIG. 1D) subsequently formed may be same or different. A method of forming the barrier material layer 20 is a solution process such as a spin coating method, a die coating method and a roll coating method. The method of forming the barrier material layer 20 comprises, for example, dissolving the dielectric material in a first solvent, and further coating the dielectric material dissolved in the first solvent on the organic active material layer 18, wherein the organic active material layer 18 is indissolvable in the first solvent. If the method of forming the organic active material layer 18 comprises dissolving the organic material in a second solvent, and further filling the channel region 12 between the source 14 and the drain 16 (or the source 16 and the drain 14) and covering the source 14 and the drain 16 (or the source 16 and the drain 14) with the organic material dissolved in the second solvent by coating, the second solvent and the first solvent have different polarities. By forming the barrier material layer 20 using a coating method, the formed barrier material layer 20 has excellent uniformity, and the coating method may be performed under low temperatures, for example under 150 degrees centigrade. Hence, compared with conventional inorganic processes, the coating method is extremely suitable for fabricating TFTs using a flexible substrate.

Afterwards, a patterned photosensitive layer 22 is formed on the barrier material layer 20. A method of forming the patterned photosensitive layer 22 comprises, for example, forming a photosensitive material layer, then patterning the photosensitive material layer by exposure and development to form the photosensitive layer 22. A material of the photosensitive material layer includes a UV-curable material, which may be a positive type or a negative type. The photosensitive layer 22 is a photoresist layer, for example. A thickness of the photosensitive layer 22 is, for example, 0.1 to 1 micrometer. Since the photosensitive layer 22 is patterned by an exposure method, the photosensitive layer 22 is accurately aligned and thus fine patterns are formed.

Figure 1C:
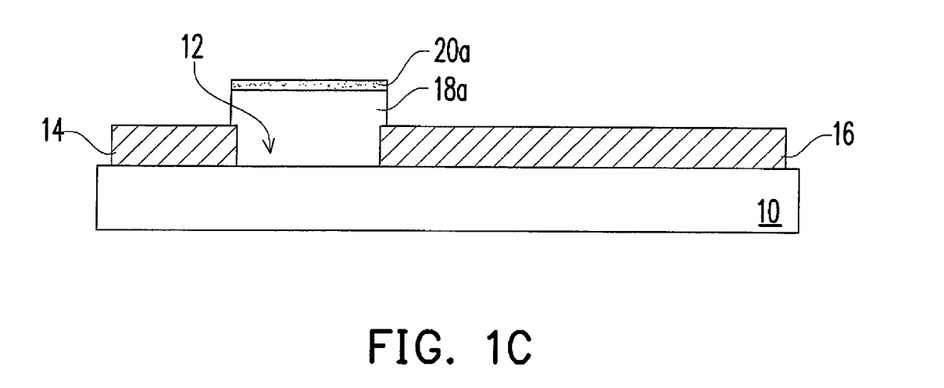

Then, referring to FIGS. 1B and 1C, using the patterned photosensitive layer 22 as a mask, the etching process is performed to remove a part of the barrier material layer 20 and a part of the organic active material layer 18 (shown on FIG. 1B). Thereby, a barrier layer 20a and an organic active layer 18a are formed in the channel region 12 between the source 14 and the drain 16 (or the source 16 and the drain 14) and surfaces of the source 14 and the drain 16 (or the source 16 and the drain 14) are exposed (shown on FIG. 1C). Next, the patterned photosensitive layer 22 is further removed. A method of removing the part of the barrier material layer 20 and the part of the organic active material layer 18 and the patterned photosensitive layer 22 comprises, for example, performing the etching process using oxygen plasma.

Figure 1D:
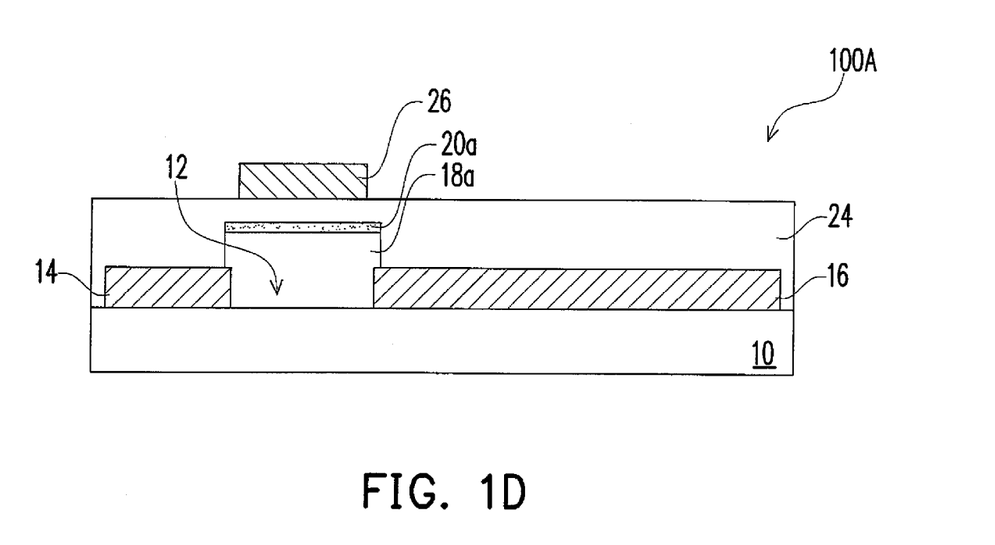

Afterwards, referring to FIG. 1D, the dielectric layer 24 is formed on the substrate, covering upper surfaces of the source 14, the drain 16 (or the source 16, the drain 14)) and the barrier layer 20a and sidewalls of the barrier layer 20a and the organic active layer 18a. The material of the dielectric layer 24 includes an inorganic dielectric material or an organic dielectric material. The inorganic dielectric material is, for example, silicon oxide or silicon nitride. The organic dielectric material is, for example, poly(4-vinyl phenol) (PVP) or parylene. A method of forming the dielectric layer 24 comprises, for example, a chemical vapor deposition method, a printing method, a spin coating method, an ink-jet method, a dip coating method, an evaporation method or other physical deposition methods. Since the surface of the organic active layer 18a is covered by the barrier layer 20a and the side of the organic active layer 18a is covered by the dielectric layer 24, sidewall leakage problems caused by the organic active layer 18a being exposed in air and being destroyed by moisture or oxygen are avoided.

Then, a gate 26 is formed on the dielectric layer 24 between the source 14 and the drain 16 (or the source 16 and the drain 14), completing fabricating an OTFT 100A of the top gate structure. A method of forming the gate 26 comprises, for example, forming a gate material layer, and patterning the gate material layer using photolithographic and etching processes. A material of the gate material layer includes a metal or doped polysilicon. The metal is, for example, aluminum, copper, molybdenum, chromium or alloys of above. A method of forming the gate material layer comprises, for example, a physical vapor deposition process or a chemical vapor deposition process. The physical vapor deposition process is, for example, a sputtering process or an evaporation process. According to another embodiment, the method of forming the gate 26 may comprise directly forming a patterned conductive layer, for example with an inkjet printing method or other printing or transfer printing technologies. Then, an interlayer dielectric layer (not shown) may be formed on the substrate 10 to cover the gate 26 and the dielectric layer 24.

FIGS. 2A to 2D are cross-sectional views illustrating a method of fabricating an OTFT of a bottom gate structure according to another embodiment of the present invention. Materials and method of formation of components of the OTFT of the following are similar to that according to the above embodiment, and are not repeatedly described for simplification.

Figure 2A:
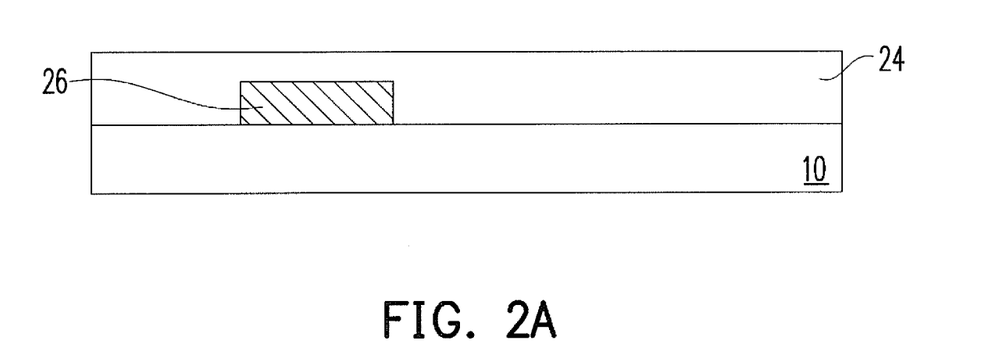
FIGS. 2A to 2D are cross-sectional views illustrating a method of fabricating an OTFT of a bottom gate structure according to another embodiment of the present invention.

First, referring to FIG. 2A, the gate 26 is formed on the substrate 10, and then the dielectric layer 24 is formed on the substrate 10 to cover the gate 26.

Figure 2B:
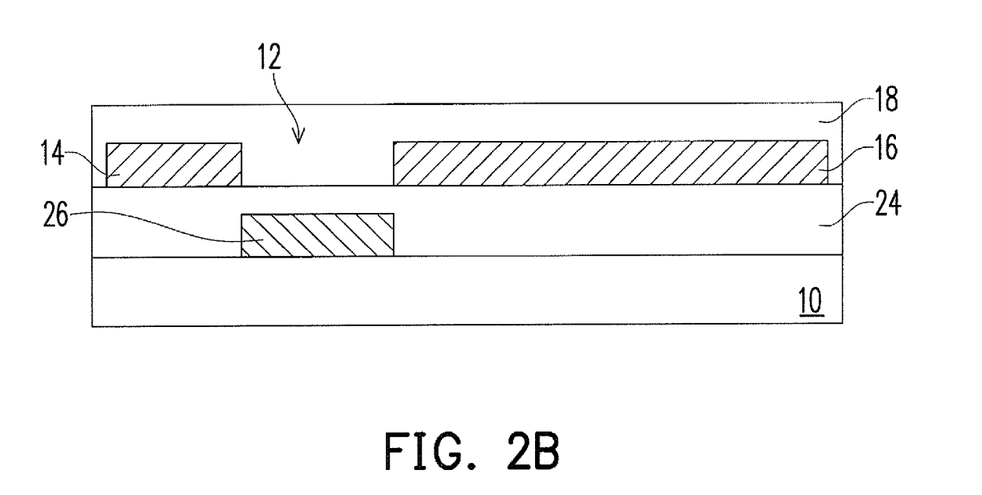

Then, referring to FIG. 2B, the source 14 and the drain 16 (or the source 16 and the drain 14) are formed on the dielectric layer 24 at the two sides of the gate 26. Next, the organic active material layer 18 is formed on the substrate 10.

Figure 2C:
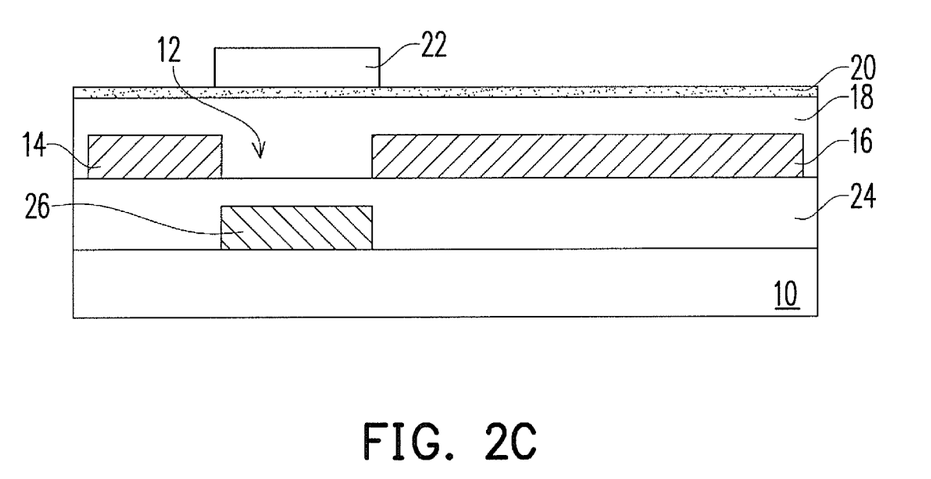

Then, referring to FIG. 2C, the barrier material layer 20 is formed on the organic active material layer 18. Next, the patterned photosensitive layer 22 is formed on the barrier material layer 20. The thickness of the photosensitive layer 22 is not specifically limited, which is for example, 0.5 to 5 micrometers.

Figure 2D:
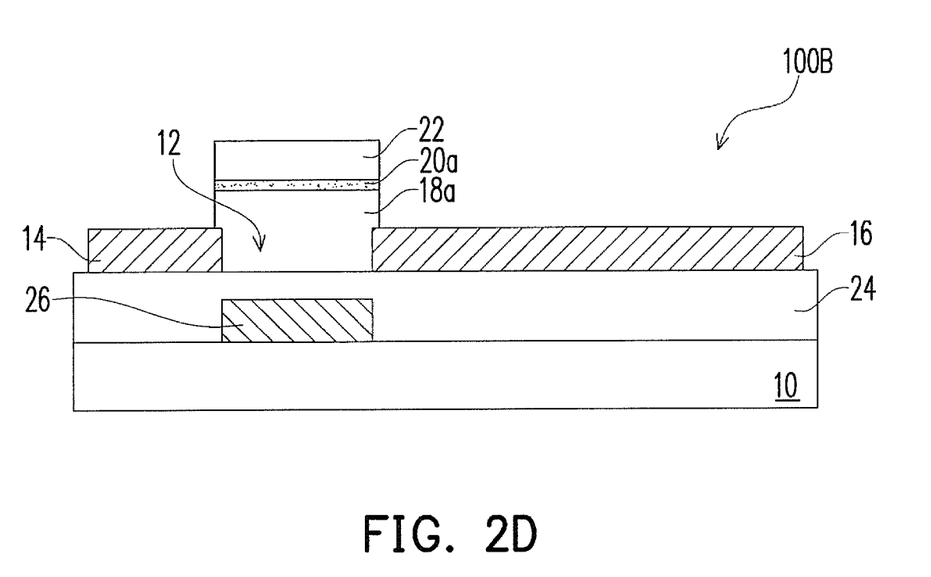

Afterwards, referring to FIGS. 2C and 2D, using the patterned photosensitive layer 22 as the mask, the part of the barrier material layer 20 and the part of the organic active material layer 18 are removed to form the barrier layer 20a and the organic active layer 18a in the channel region 12 between the source 14 and the drain 16 (or the source 16 and the drain 14), thereby exposing the surfaces of the source 14 and the drain 16 (or the source 16 and the drain 14). Next, the patterned photosensitive layer 22 may be selectively removed, meaning that the patterned photosensitive layer 22 can be removed or preserved, completing an OTFT 100B of the bottom gate structure.

Afterwards, the interlayer dielectric layer (not shown) is formed on the substrate 10 to cover the surfaces of the source 14, the drain 16 (or the source 16, the drain 14) and the barrier layer 20a and the sidewalls of the barrier layer 20a and the organic active layer 18a.

Figure 3A:
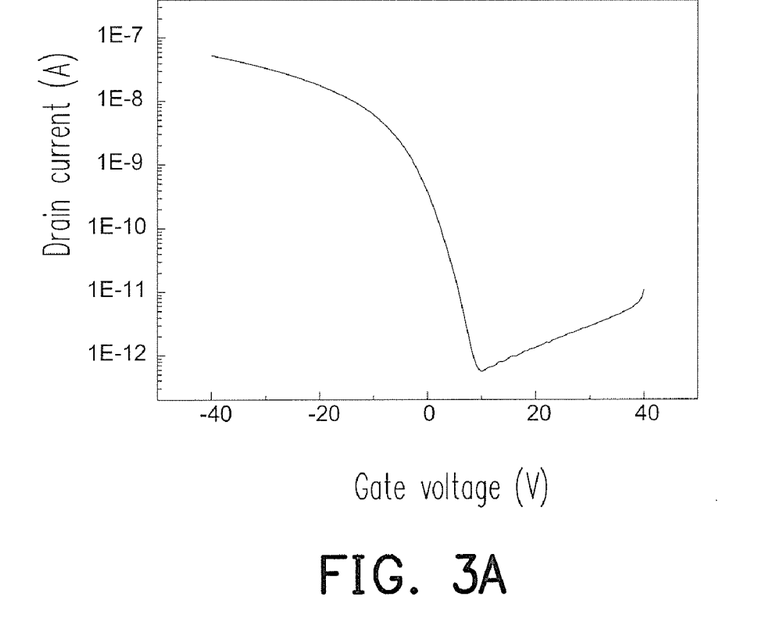
FIG. 3A is an electrical characteristic view showing an OTFT of a top gate structure formed by patterning an organic active layer using a method according to the embodiment of the present invention.
Figure 3B:
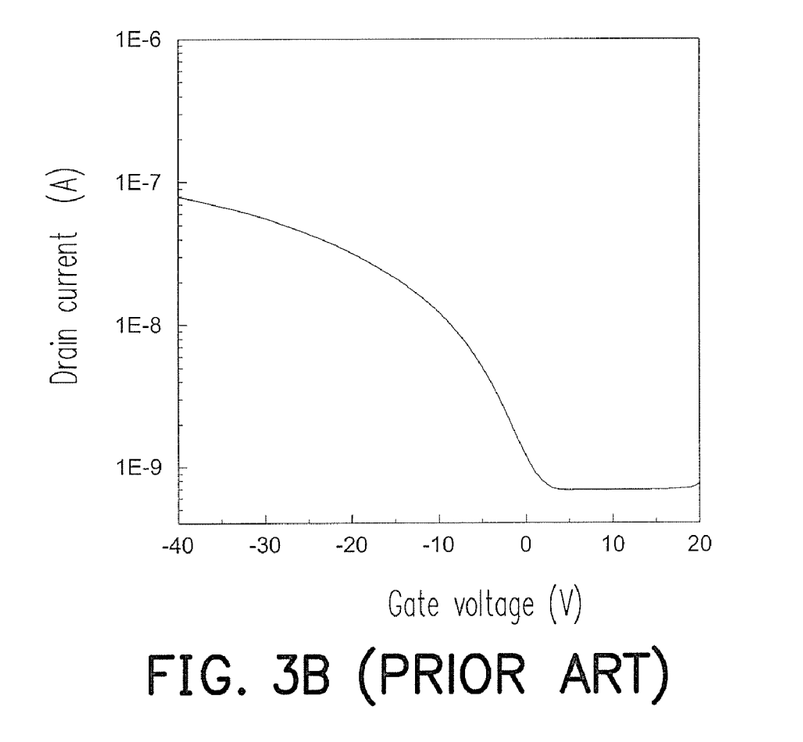
FIG. 3B is an electrical characteristic view showing an OTFT of a top gate structure formed by not patterning an organic active layer according to the prior art.
Figure 4A:
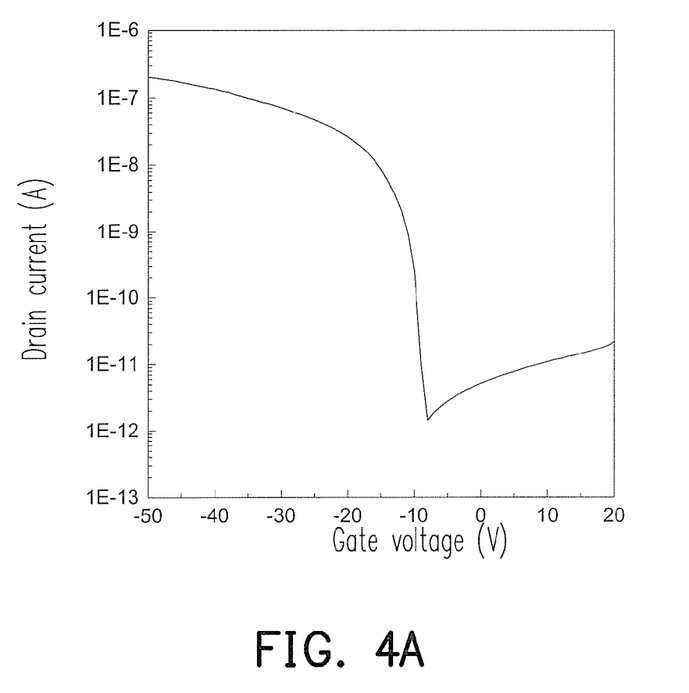
FIG. 4A is an electrical characteristic view showing an OTFT of a bottom gate structure formed by patterning an organic active layer using a method according to the embodiment of the present invention.
Figure 4B:
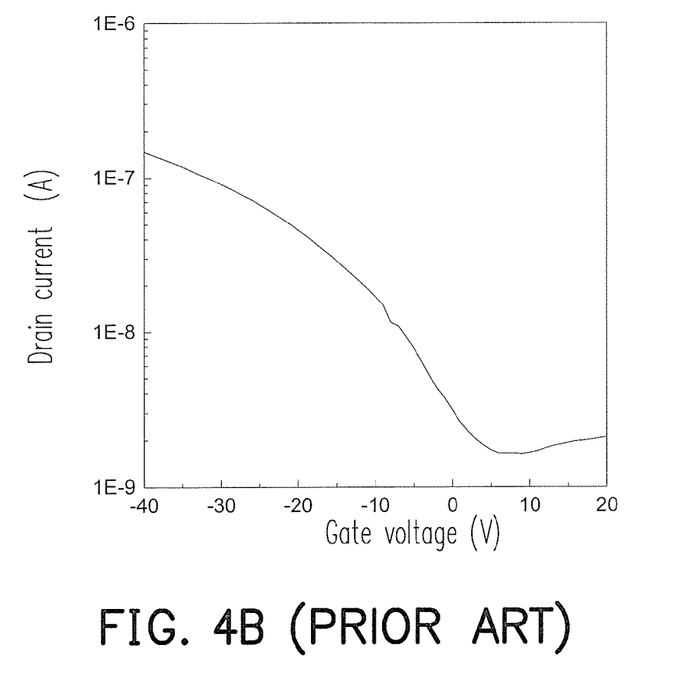
FIG. 4B is an electrical relationship view showing an OTFT of a bottom gate structure formed by not patterning an organic active layer according to the prior art.

FIGS. 3A and 3B are electrical characteristic views showing OTFTs of top gate structures formed by and not by patterning organic active layers using methods according to the embodiments of the present invention and the prior art respectively. FIGS. 4A and 4B are electrical characteristic views showing OTFTs of bottom gate structures formed by and not by patterning organic active layers using methods according to the embodiments of the present invention and the prior art respectively. Relative results are shown as in Table 1.

TABLE 1

| | OTFT | | | |
|---|---|---|---|---|
| | Top gate structure | | Bottom gate structure | |
| | Organic active layer | | | |
| | Patterned | Unpatterned | Patterned | Unpatterned |
| Line width W/Space L (micrometer/micrometer) | 200/20 | 200/20 | 200/100 | 200/100 |
| Mobility rate ($cm^2/V \cdot second$) | $2.5 \times 10^{-3}$ | $3.6 \times 10^{-3}$ | $1.1 \times 10^{-2}$ | $5.9 \times 10^{-3}$ |
| On/off current ratio | $1.3 \times 10^5$ | $1.04 \times 10^2$ | $1.2 \times 10^4$ | $4.3 \times 10^2$ |
| Threshold voltage (V) | 8.2 | −2.86 | −13.38 | −6.35 |

Referring to the above Table, the OTFT formed according to the embodiments of the present invention has excellent functional characteristics.

In summary, the method of the present invention uses the photolithographic and etching processes to pattern the organic active layer. Hence, the very fine patterns can be defined, so that the organic active layer solely covers the channel region, and does not cover or only slightly covers parts of the source and the drain region. Moreover, since it is the dielectric layer that directly covers the source and the drain, problems of components on non-channel regions having undesirable optical characteristics due to the organic active layer being unpatterned are improved. Furthermore, since the surface of the organic active layer is covered by the barrier layer and the sidewall of the organic active layer is covered by the dielectric layer, the sidewall leakage problems caused by the organic active layer being exposed in air and being destroyed by moisture or oxygen are avoided. In addition, the method according to the embodiments of the present invention may be completed under temperatures lower than 150 degrees centigrade. Hence, the components have excellent functional characteristics and reliability of the components is enhanced. Additionally, the processes of the OTFT disclosed according to the embodiments of the present invention are simple and may be completed using coating processes and in large areas. Therefore, costs of using expensive machinery are reduced, and costs of materials of the processes and costs the processes are also reduced. The method of the present invention is therefore suitable for being used in mass production.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method of fabricating an organic thin film transistor (OTFT), comprising:
    forming a source, a drain and a gate on a substrate;
    forming a dielectric layer to isolate the gate from the source and drain;
    forming an organic active material layer on the substrate to fill a channel region between the source and the drain and cover the source and the drain;
    forming a barrier material layer on the organic active material layer, wherein a method of forming the barrier material layer comprises dissolving a barrier material in a first solvent, and coating the barrier material dissolved in the first solvent on the organic active material layer, the organic active material layer being indissolvable in the first solvent; and
    patterning the barrier material layer and the organic active material layer to form a barrier layer and an organic active layer in the channel region, exposing the source and the drain.

2. The method of fabricating the OTFT of claim 1, wherein a material of the barrier material layer comprises dielectric material.

3. The method of fabricating the OTFT of claim 2, wherein the dielectric material comprises poly-4-vinylphenol, polyvinyl alcohol or parylene.

4. The method of fabricating the OTFT of claim 1, wherein a material of the barrier material layer and a material of the dielectric layer are same.

5. The method of fabricating the OTFT of claim 1, wherein a material of the barrier material layer and a material of the dielectric layer are different.

6. The method of fabricating the OTFT of claim 1, wherein a method of forming the barrier material layer comprises a spin coating method, a die coating method or a roll coating method.

7. The method of fabricating the OTFT of claim 1, wherein a method of forming the active material layer comprises dissolving an active material in a second solvent, and coating the active material dissolved in the second solvent on the channel region between the source and the drain and covering the source and the drain, the second solvent and the first solvent having different polarities.

8. The method of fabricating the OTFT of claim 1, wherein a material of the organic active material layer comprises organic small molecules, organic polymers, or mixtures of organic small molecules and organic polymers.

9. The method of fabricating the OTFT of claim 1, wherein the OTFT is a top gate structure, the above steps being performed in following sequence:
    forming the source and the drain on the substrate;
    forming the organic active material layer on the substrate;
    forming the barrier material layer on the organic active material layer;
    patterning the barrier material layer and the organic active material layer to form the barrier layer and the organic active layer in the channel region;
    forming the dielectric layer on the substrate, covering the source, the drain and the barrier layer; and
    forming the gate on the dielectric layer between the source and the drain.

10. The method of fabricating the OTFT of claim 9, wherein the step of patterning the barrier material layer and the organic material layer comprises:

forming a patterned photosensitive layer on the barrier material layer;

using the patterned photosensitive layer as a mask, removing a part of the barrier material layer and a part of the organic active material layer to form the barrier layer and the organic active layer in the channel region, exposing the source and the drain; and removing the patterned photosensitive layer.

11. The method of fabricating the OTFT of claim 10, wherein a thickness of the patterned photosensitive layer is 0.1 to 1 micrometer.

12. The method of fabricating the OTFT of claim 1, wherein the OTFT is a bottom gate structure, the above steps being performed in following sequence:

forming the gate on the substrate;

forming the dielectric layer on the substrate, covering the gate;

forming the source and the drain on the dielectric layer on two sides of the gate;

forming the organic active material layer on the substrate;

forming the barrier material layer on the organic active material layer; and patterning the barrier material layer and the organic active material layer to form the barrier layer and the organic active layer in the channel region.

13. The method of fabricating the OTFT of claim 12, wherein the step of patterning the barrier material layer and the organic active material layer comprises:

forming a patterned photosensitive layer on the barrier material layer; and using the patterned photosensitive layer as a mask, removing a part of the barrier material layer and a part of the organic active material layer to form the barrier layer and the organic active layer in the channel region, exposing the source and the drain.

14. The method of fabricating the OTFT of claim 12, further comprising after removing the part of the barrier material layer and the part of the organic active material layer, removing the patterned photosensitive layer.

15. The method of fabricating the OTFT of claim 12, further comprising after removing the part of the barrier material layer and the part of the organic active material layer, preserving the patterned photosensitive layer.

16. The method of fabricating the OTFT of claim 1, wherein the substrate is a rigid substrate or a flexible substrate.

17. An OTFT, comprising:

a gate, disposed on a substrate;

a source and a drain disposed on two sides of the gate;

a dielectric layer disposed on a substrate to isolate the gate from the source and the drain;

an organic active layer disposed on a channel region between the source and the drain, corresponding to the gate; and a barrier layer disposed on the organic active layer, wherein the OTFT is a top gate structure, the source and the drain are disposed on the substrate, the gate is disposed on the source and the drain, and the barrier layer is disposed between the dielectric layer and the organic active layer.

18. The OTFT of claim 17, wherein the OTFT is a bottom gate structure, the gate is disposed on the substrate and below the source and the drain, and the organic active layer is disposed between the barrier layer and the dielectric layer.

19. The OTFT of claim 17, wherein a material of the barrier layer comprises dielectric material.

20. The OTFT of claim 19, wherein the dielectric material comprises poly-4-vinylphenol, polyvinyl alcohol or parylene.

21. The OTFT of claim 17, wherein a material of the barrier material layer and a material of the dielectric layer are same.

22. The OTFT of claim 17, wherein a material of the barrier material layer and a material of the dielectric layer are different.

23. The OTFT of claim 17, wherein a material of the organic active layer comprises organic small molecules, organic polymers, or mixtures of organic small molecules and organic polymers.

24. The OTFT of claim 17, wherein the substrate is a rigid substrate or a flexible substrate.

* * * * *